United States Patent [19]
Cha

[11] Patent Number: 5,854,740
[45] Date of Patent: Dec. 29, 1998

[54] ELECTRONIC CIRCUIT BOARD WITH SEMICONDUCTOR CHIP MOUNTED THEREON, AND MANUFACTURING METHOD THEREFOR

[75] Inventor: Gi-Bon Cha, Cheongju-si, Rep. of Korea

[73] Assignee: LG Semicon Co., Ltd., Chungcheongbuk-do, Rep. of Korea

[21] Appl. No.: 639,650

[22] Filed: Apr. 29, 1996

[30] Foreign Application Priority Data

Apr. 27, 1995 [KR] Rep. of Korea .................. 95-10040

[51] Int. Cl.⁶ .................. H05K 7/02; H05K 1/14; H01R 9/09
[52] U.S. Cl. .................. 361/760; 174/260; 257/723; 361/783; 361/776
[58] Field of Search .................. 174/52.1, 52.2, 174/52.3, 52.4, 260, 261, 268; 257/666, 668, 676, 678, 700, 723, 724, 779, 780, 774, 786, 787, 790; 361/760, 772, 774, 776, 783, 807, 809, 813, 761, 764; 438/209, 219, 611, 617, 125, 126, 127; 439/68, 83; 29/832, 850

[56] References Cited

U.S. PATENT DOCUMENTS 5,243,497 9/1993 Chiu .................. 361/783
5,280,192 1/1994 Kryzaniwsky .................. 257/723

FOREIGN PATENT DOCUMENTS

| 61-137335 | 6/1986 | Japan | .................. 437/219 |
| 4268753 | 9/1992 | Japan . | |
| 4273150 | 9/1992 | Japan . | |
| 4284663 | 10/1992 | Japan . | |

Primary Examiner—Donald Sparks
Attorney, Agent, or Firm—Loudermilk & Associates

[57] ABSTRACT

An electronic circuit board with one or more semiconductor chips installed thereon, and a manufacturing method therefor, are disclosed. The circuit board with semiconductor chips installed thereon includes: one or more semiconductor chips; an insulated circuit board having wire bonding pads for connection to the bonding pads of the semiconductor chips; a plurality of wires connected between the bonding pads of the semiconductor chips and the wire bonding pads of the circuit board; and a plurality of protecting covers for insulating the wires and the semiconductor chips. The circuit board includes an opening smaller than the semiconductor chips, and wire bonding pads formed around the opening. The semiconductor chip includes bonding pads which are formed on the central portion of the surface of the semiconductor chip. The protective cover covers the chip and the wires.

23 Claims, 3 Drawing Sheets

ELECTRONIC CIRCUIT BOARD WITH SEMICONDUCTOR CHIP MOUNTED THEREON, AND MANUFACTURING METHOD THEREFOR

FIELD OF THE INVENTION

The present invention relates to electronic circuit boards with semiconductor chips installed thereon and manufacturing methods therefor, and more particularly to methods for making electronic circuit boards with semiconductor chips installed thereon such as memory modules, interface boards and the like.

BACKGROUND OF THE INVENTION

Recently, electronic circuits for carrying out particular functions are manufactured by a method in which several IC packages are mounted on a printed circuit board. An example of such board products are memory modules that are widely used in computers. A method for installing semiconductor IC packages on a printed circuit board and its structure will now be described.

FIGS. 1A to 1C illustrate a conventional memory module. FIG. 1A is a plan view of the conventional memory module; FIG. 1B is a side view of the conventional memory module; and FIG. 1C is a partial sectional view of the conventional memory module. In this module, semiconductor packages 12 are installed on circuit board 10. On part of the circuit board, tap terminals 14 are provided for forming electrical connections by insertion within slots of one or more connectors (not shown). Further, the leads of the ICs are electrically connected to the tap terminals through wiring formed on the circuit board.

In this conventional module, the methods for connecting the IC packages to the wiring on the circuit board generally are classified into surface mounting methods, and through-type mounting methods. Of them, surface mounting methods typically allow IC packages with very small spacing between the leads to be effectively connected to the wiring, and, therefore, such surface mounting methods are widely used in installing gull wing lead-type semiconductor devices.

Such a method is carried out in the following manner. A solder paste is spread or printed, solder bumpers 17 are formed on pads 16 of circuit board 10. Then packages 12 are exactly placed in the relevant positions, and the solder bumper are melted by applying a reflow process, thereby connecting leads 13 of the packages to pads 16 of the circuit board. That is, a printed circuit board is manufactured, and a solder paste is spread thereon so as to form solder bumps of a proper size on the pads of the circuit board. Then semiconductor packages are installed thereon, and a heat treatment is carried out to reflow the solder bumps, thereby connecting the leads of the semiconductor packages to the bonding pads of the circuit board.

In this conventional method for installing semiconductor devices on a circuit board, the packaged semiconductor products have to be installed on a printed circuit board, and, therefore, the process is fastidious, as well as having an increased installation cost.

Further, since packaged semiconductor products are used, the bulk and weight of the memory module products and the memory cards are increased, which is disadvantageous with respect to the miniaturizing trend of electronic apparatuses.

SUMMARY OF THE INVENTION

The present invention is intended to overcome the above-described disadvantages of the conventional techniques.

Accordingly, it is an object of the present invention to provide a semiconductor device installation method and a circuit board with semiconductor devices installed thereon, in which the bulk and weight after the installation of the semiconductor devices on a circuit board is small, and a wire bonding method is used in manufacturing the printed circuit board.

In achieving the above and other objects, a circuit board with semiconductor chips installed thereon according to the present invention includes: one or more semiconductor chips with bonding pads formed on the surface for connecting internal electronic circuits of the chips to external circuits; an insulated circuit board having wire bonding pads for connection to the bonding pads of the semiconductor chips; a plurality of wires connected between the bonding pads of the semiconductor chips and the wire bonding pads of the circuit board; and a plurality of protecting covers for insulating the wires and the semiconductor chips.

The circuit board includes a small opening smaller than a semiconductor chip, and wire bonding pads formed around the opening. The semiconductor chip includes bonding pads which are formed on the central portion of the surface of the semiconductor chip. The wires connect the bonding pads of the semiconductor chip to the wire bonding pads of the circuit board. The protective cover(s) cover the chip and the wires. The semiconductor chip is attached to a chip attaching means which is formed around the opening of the circuit board, i.e., an insulating tape or an insulating paste. The protective cover(s) may be formed by molding an epoxy molding compound.

In another aspect of the present invention, a method for manufacturing an electronic circuit board by installing semiconductor chips according to the present invention includes the steps of: preparing semiconductor chips having bonding pads for connecting internal electronic circuits of the chips to external circuits; preparing an insulated circuit board having openings smaller than the area of the semiconductor chip, and having wire bonding pads around each of the openings for connection to the bonding pads of the semiconductor chips; attaching each of the semiconductor chips into a side of the opening of the circuit board by using an adhesive; connecting the bonding pads of the semiconductor chip to the wire bonding pads of the circuit board with wires; and carrying out a molding to cover the semiconductor chips and the wires so as to make them an integral part of the circuit board.

BRIEF DESCRIPTION OF THE DRAWINGS

The above objects and other advantages of the present invention will become more apparent by describing in detail the preferred embodiments of the present invention with reference to the attached drawings in which.

DESCRIPTION OF THE PREFERRED EMBODIMENTS

Figure 2A:
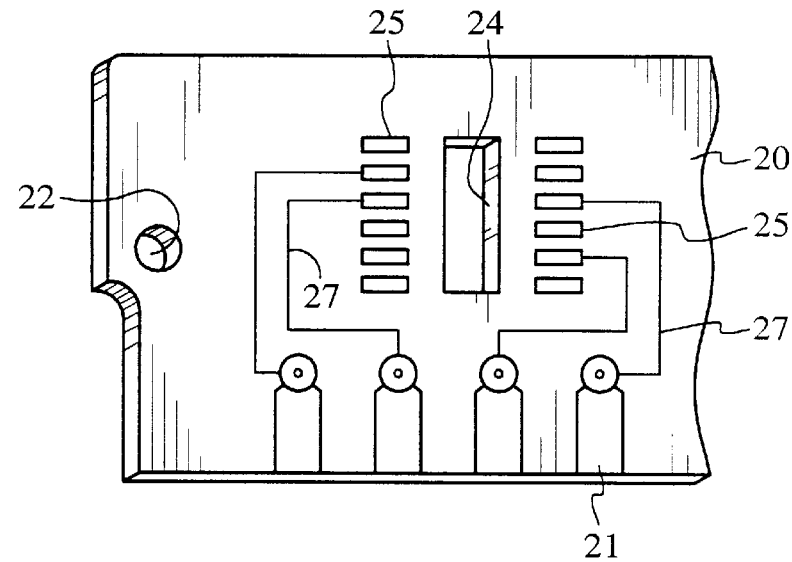
FIGS. 2A–2B illustrate an electronic circuit board according to the present invention.
Figure 2B:
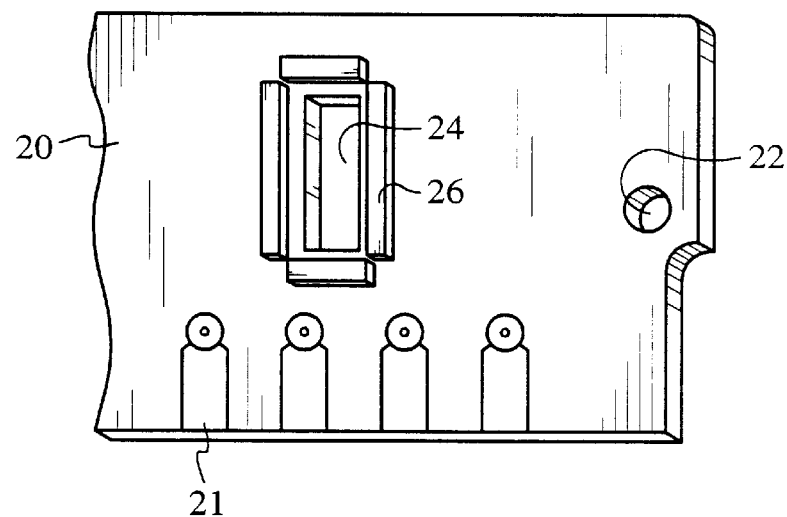

FIGS. 2A and 2B are perspective views each illustrating a part of the circuit board.

Circuit board 20 preferably is an insulated board. Tap terminals 21 are formed on a corner or edge of the circuit board, so that tap terminals 21 may be connected to connecting terminals of slots of one or more connectors. Further, opening 24 having an area smaller than the area of the chip is formed on circuit board 20. Around opening 24 formed on a face (e.g., upper face) of circuit board 20, a plurality of wire bonding pads 25 are formed for connection to the bonding pads of the chip. Wiring 27 is formed such that the wire bonding pads are respectively connected to tap terminals 21 of circuit board 20. Meanwhile, referring to FIG. 2B, around opening 24 on the other face (e.g., lower face) of the circuit board, chip attaching means 26 are formed for attaching the chips. Chip attaching means 26 may consist of an insulating tape or an insulating paste. In the drawings, reference code 22 indicates a hole which may be used for attaching the circuit board to other boards or equipment, etc.

Figure 2C:
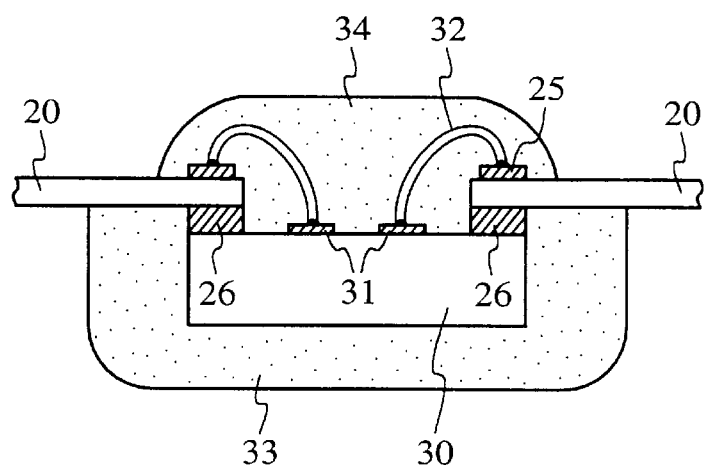

FIG. 2C is a partial sectional view illustrating the semiconductor chips assembled to the circuit board. Semiconductor chip 30 on which bonding pads 31 are formed at a central portion thereof is attached to attaching means 26 formed on the lower face of circuit board 20. Bonding pads 31 are connected to wire bonding pads 25 of circuit board 20 by means of wires 32. The wire is selected from a group consisting of gold wire, aluminum wire, copper wire and palladium wire. The bonding area is either coated with an insulating coating material, or is covered with protective layers 33 and 34 by carrying out a molding process (e.g., such as resin molding) at the top and bottom.

A method for manufacturing an electronic circuit board according to the present invention is carried out in the following manner. Semiconductor chip 30 is prepared and has bonding pads 31 formed on a central portion of the surface thereof for connecting internal electronic circuits of semiconductor chip 30 to external circuits. Insulated circuit board 20 is prepared and has opening 24 having an area smaller than the area of semiconductor chip 30, and on which wire bonding pads 25 are disposed around opening 24 for connection to bonding pads 31 of chip 30.

Semiconductor chip 30 is attached to attaching means 26 which is formed on the lower face of circuit board 20. Bonding pads 31 are wire-bonded to wire bonding pads 25 of circuit board 20 with gold wire, aluminum wire, copper wire, palladium wire, etc.

After carrying out the above process steps, in order to protect the bonded area from the outside, protective layer 34 is formed in such a manner that bonding wires 32 and the wire bonding pads should be completely covered. Preferably, a molding is then carried out for covering semiconductor chip 30 on the lower face. Protective layer 33 and lower protective layer 34 for protecting the semiconductor chips of the lower face also may be simultaneously formed by applying a molding process. Alternatively, the wire bonding area of the upper face is coated with an insulating coating material, and then a molding is carried out so as to form protective layers 33 and 34.

In such ways, the process of coupling the chip and circuit board is accomplished in the preferred embodiments.

Figure 3A:
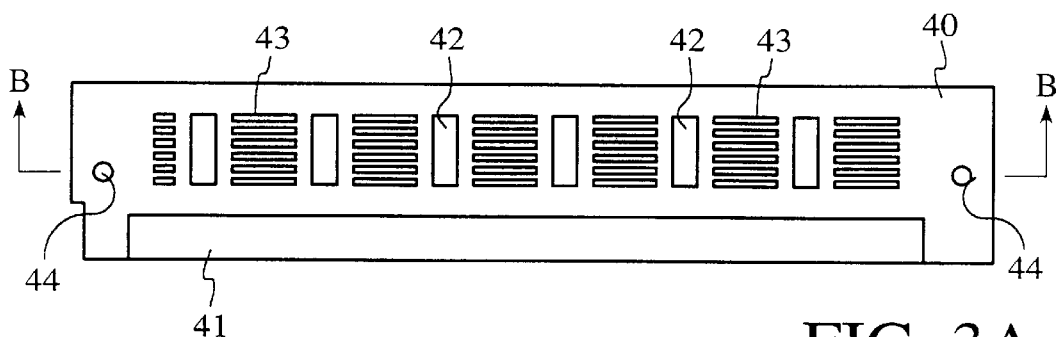
FIGS. 3A–3E illustrate preferred embodiments of the present invention.
Figure 3B:
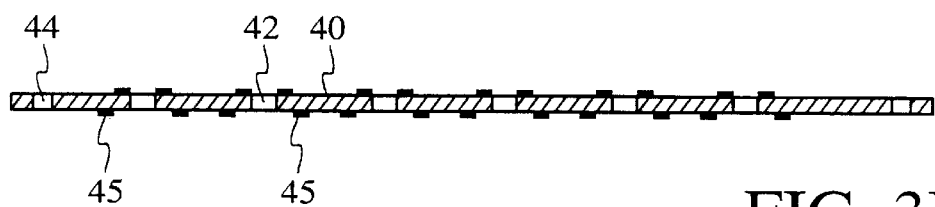
Figure 3C:
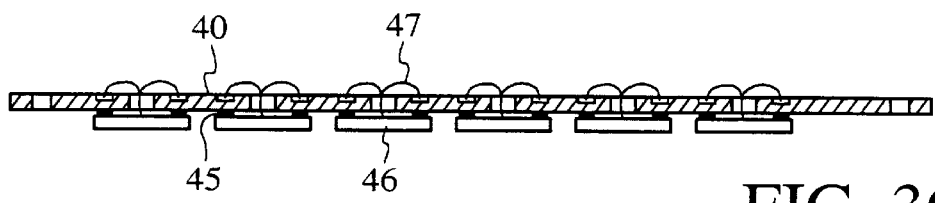
Figure 3D:
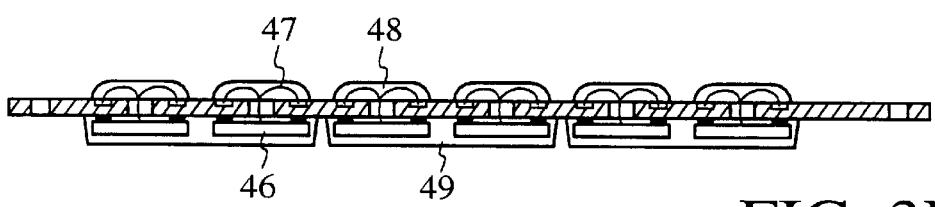
Figure 3E:
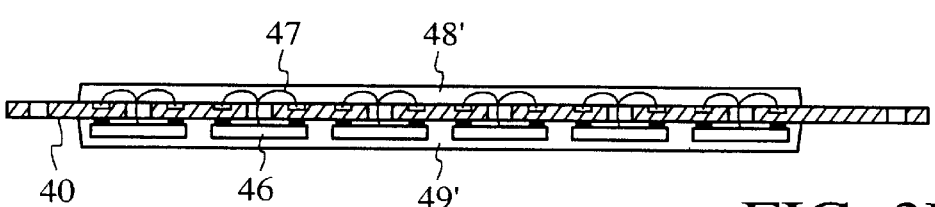

FIGS. 3A to 3E schematically illustrate a memory module in accordance with the present invention. FIG. 3A is a plan view of the circuit board; FIG. 3B is a sectional view taken along line B-B of the circuit board; FIG. 3C is a sectional view illustrating the structure in which chips are attached, and in which the wire-bonding is completed; and FIGS. 3D and 3E are sectional views illustrating the structure after formation of the protective layer.

Figure 1A:
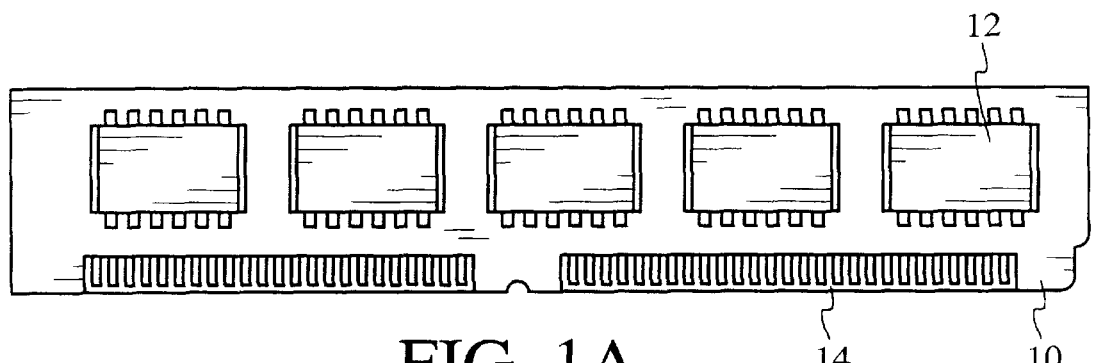
FIGS. 1A–1C illustrate a conventional memory module.
Figure 1B:
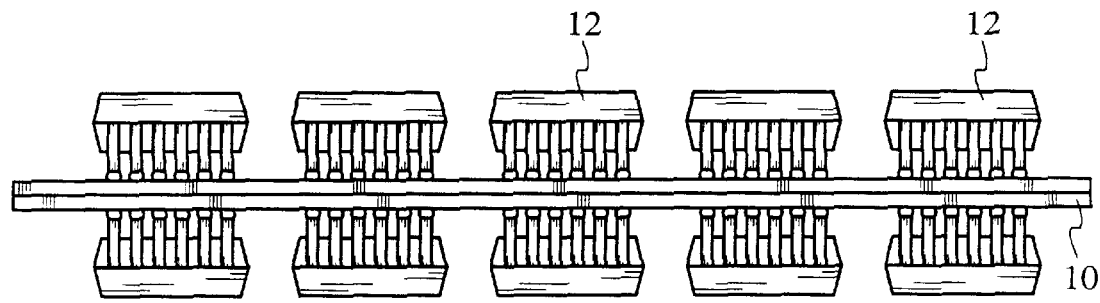
Figure 1C:
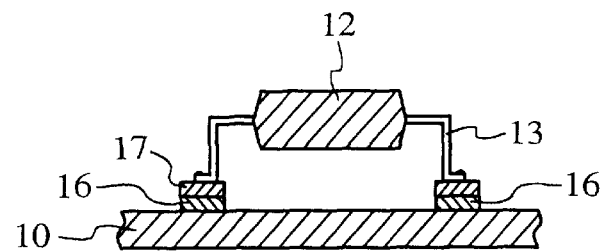

As will be understood from the drawings, on memory module circuit board 40, tap terminal formation portion 41 is formed (containing a plurality of tap terminals), and also openings 42 are formed for exposing the bonding pads of the chips. Around openings 42 wire bonding pads 43 are formed. Attaching holes 44 may be formed on one side or both sides of board 40. Although not shown in the drawings, it should be understood that wiring is formed on board 40 so that wire bonding pads 43 and the tap terminals (see, e.g., tap terminals 14 in FIG. 1A) are appropriately connected through the wiring. As illustrated in FIG. 3B, attaching means 45 are formed around openings 42 on the lower face of circuit board 40. The specific structure may be as is illustrated in FIGS. 2A to 2C.

As illustrated in FIG. 3C, chips 46 are attached to attaching means 45, and the bonding pads of chips 46 and the wire bonding pads of board 40 are connected together by means of wires 47.

As illustrated in FIGS. 3D and 3E, the protective cover consists of upper protective layer 48, which may be formed on the bonding portion, and lower protective layer 49 for protecting the lower chips. As illustrated in FIG. 3D, upper protective layer 48 may cover only the bonding portion, and the lower protective layers only certain of chips 46. Alternatively, as illustrated in FIG. 3E, upper protective layer 48' and lower protective layer 49' may be expanded to cover all the bonding portions and chips 46, respectively. Alternatively, only several of bonding portions and chips may be covered by the protective layers, etc.

According to the present invention as described above, chips may be directly attached on a printed circuit board, with the result that a thin and simple circuit board may be formed, and a lead frame is not required. In the packaging process, a trimming process and a forming process are not necessary, and accompanying processes after the molding process may be eliminated. Further, the mounting efficiency may be improved with the same size printed circuit board, with the result that the memory capacity may be increased.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A circuit board, comprising:
   a plurality of semiconductor chips having bonding pads formed on a surface thereof for connecting internal electronic circuits of the semiconductor chips to external circuits;
   a circuit board having an upper surface, a lower surface, a plurality of terminals, and a plurality of openings, wherein the upper surface of the circuit board comprises a plurality of bonding pads formed around the openings, wherein the bonding pads are electrically coupled to the terminals, wherein each of the semiconductor chips is attached to the lower surface of the circuit board over one of the openings with a chip attaching means;
   a plurality of wires coupling the bonding pads on the semiconductor chip to respective bonding pads on the circuit board; and
   one or more protective covers covering the semiconductor chips and the wires, wherein at least one of the protective covers extends over more than one of the semiconductor chips.

2. The circuit board of claim 1, wherein at least one of the semiconductor chip includes bonding pads formed on a central portion of a surface thereof.

3. The circuit board of claim 1, wherein the chip attaching means comprises an insulating tape.

4. The circuit board of claim 1, wherein the chip attaching means comprises an insulating paste.

5. The circuit board of claim 1, wherein the one or more protective covers comprise an epoxy molding compound.

6. The circuit board of claim 1, wherein at least one of the semiconductor chips comprises a memory device, wherein the circuit board comprises a memory module.

7. The circuit board of claim 1, wherein the circuit board is used as a system board.

8. The circuit board of claim 1, wherein the one or more protective covers comprise one or more upper protective covers covering the wires and one or more lower protective covers covering the semiconductor chips attached to the lower surface of the circuit board, wherein at least one of the lower protective covers extends over more than one of the semiconductor chips.

9. The circuit board of claim 8, wherein the at least one of the lower protective covers extends over all of the semiconductor chips.

10. The circuit board of claim 8, wherein the one or more upper protective covers comprises a single upper protective cover covering all of the wires and extending over all of the semiconductor chips.

11. The circuit board of claim 8, wherein the one or more protective covers comprise a single resin molded upper protective cover extending over all of the wires and over all of the semiconductor chips and a single resin molded lower protective cover extending over all of the semiconductor chips.

12. A method for manufacturing a circuit board comprising the steps of:

preparing a plurality of chips having bonding pads for connecting internal electronic circuits of the plurality of chips to external circuits;

preparing the circuit board having an upper surface, a lower surface, terminals, and a plurality of openings, wherein a plurality of bonding pads are formed around the openings on the upper surface, wherein the bonding pads are electrically connected to the terminals;

attaching the chips to the lower surface of the circuit board over the openings;

coupling a plurality of wires from the bonding pads on the chips through the openings to the bonding pads on the circuit board; and covering the plurality of chips and the plurality of wires with one or more protective covers, wherein at least one of the protective covers extends over more than one of the chips.

13. The method of claim 12, wherein the one or more protective covers comprise an integral part of the circuit board.

14. The method of claim 12, wherein the chips are attached to the circuit board with an insulating tape.

15. The method of claim 12, wherein the chips are attached to the circuit board with an insulating paste.

16. The method of claim 12, wherein the chips are attached to the circuit board with an adhesive.

17. The method of claim 12, wherein the covering step comprises a molding process.

18. The method of claim 17, wherein the molding process comprises an epoxy molding process.

19. The method of claim 12, wherein the one or more protective covers comprise one or more upper protective covers covering the wires and one or more lower protective covers covering the chips attached to the lower surface of the circuit board, wherein at least one of the lower protective covers extends over more than one of the chips.

20. The method of claim 19, wherein the at least one of the lower protective covers extends over all of the chips.

21. The method of claim 19, wherein the one or more upper protective covers comprises a single upper protective cover covering all of the wires and extending over all of the chips.

22. The method of claim 19, wherein the one or more protective covers comprise a single resin molded upper protective cover extending over all of the wires and over all of the chips and a single resin molded lower protective cover extending over all of the chips.

23. The method of claim 22, wherein the single resin molded upper protective cover and the single resin molded lower protective cover are simultaneously formed.

* * * * *